United States Patent
Lai

(10) Patent No.: US 7,911,749 B2
(45) Date of Patent: Mar. 22, 2011

(54) ELECTROSTATIC DISCHARGE PROTECTION DEVICE FOR PAD AND METHOD AND STRUCTURE THEREOF

(75) Inventor: Chun-Hsiang Lai, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 437 days.

(21) Appl. No.: 11/902,990

(22) Filed: Sep. 27, 2007

(65) Prior Publication Data

US 2008/0088994 A1    Apr. 17, 2008

(30) Foreign Application Priority Data

Oct. 13, 2006   (TW) .............................. 95137794 A

(51) Int. Cl.
*H02H 9/00* (2006.01)
*H02H 3/22* (2006.01)
*H01L 23/62* (2006.01)

(52) U.S. Cl. ........... 361/56; 361/111; 257/355; 257/362
(58) Field of Classification Search .................... 361/56, 361/111; 257/355, 362
See application file for complete search history.

(56) References Cited

U.S. PATENT DOCUMENTS

| | | | |
|---|---|---|---|
| 6,545,321 B2* | 4/2003 | Morishita | 257/355 |
| 6,628,488 B2* | 9/2003 | Liu et al. | 361/56 |
| 6,919,604 B2 | 7/2005 | Lai et al. | |
| 6,947,267 B2* | 9/2005 | Liu et al. | 361/56 |
| 2002/0089017 A1 | 7/2002 | Lai et al. | |
| 2005/0254189 A1* | 11/2005 | Wu et al. | 361/56 |

FOREIGN PATENT DOCUMENTS

| | | |
|---|---|---|
| CN | 1525489 A | 9/2004 |
| CN | 1716593 A | 1/2006 |

* cited by examiner

*Primary Examiner* — Jared Fureman
*Assistant Examiner* — Lucy Thomas
(74) *Attorney, Agent, or Firm* — Bacon & Thomas, PLLC

(57) ABSTRACT

An ESD protection device for a pad includes an adjusting circuit, a snapback element and a control circuit. The adjusting circuit includes a silicon controlled rectifier (SCR) coupled to the pad. The SCR includes a first diode. The snapback element is coupled to a first N pole of the first diode when a second diode is not used, and is coupled to a second N pole of the second diode when the second diode is used. The control circuit is coupled to the first N pole. In a normal operation mode, the control circuit provides a first voltage to the first N pole so that the first N pole collects a plurality of charges and the SCR is turned off. In an ESD mode, the control circuit does not provide the first voltage to the first N pole so that the first N pole does not collect the charges.

24 Claims, 10 Drawing Sheets

US 7,911,749 B2

ELECTROSTATIC DISCHARGE PROTECTION DEVICE FOR PAD AND METHOD AND STRUCTURE THEREOF

This application claims the benefit of Taiwan application Ser. No. 95137794, filed Oct. 13, 2006, the subject matter of which is incorporated herein by reference.

BACKGROUND OF THE INVENTION

1. Field of the Invention

The invention relates in general to an electrostatic discharge (ESD) protection device and a method thereof, and more particularly to an ESD protection device for a pad and a method thereof.

2. Description of the Related Art

The electrostatic discharge (ESD) is a phenomenon of electrostatic charge transfer between different objects with the accumulation of the electrostatic charges. The ESD occurs for an extremely short period of time, which is only within the level of several nano-seconds (ns). A very high current is generated in the ESD event, and the value of the current is usually several amperes. Consequently, once the current generated by the ESD flows through a semiconductor integrated circuit, the semiconductor integrated circuit is usually damaged. Thus, the ESD protection device between power lines has to provide a discharge path to prevent the semiconductor integrated circuit from being damaged when the high-voltage electrostatic charges are generated in the semiconductor integrated circuit.

FIG. 1A (Prior Art) is a schematic illustration showing a conventional snapback element 100. As shown in FIG. 1A, the snapback element 100, such as an N-type metal oxidation semiconductor (NMOS) transistor, has a drain electrically connected to a pad 10, and a gate and a source coupled to each other and to a reference potential, such as a ground potential. Two factors of the snapback element 100 associated with the ESD event include a triggering voltage and a holding voltage. In general, the performance of the ESD is better as the triggering voltage and the holding voltage become lower.

FIG. 1B (prior art) shows a current-voltage characteristic curve of the snapback element 100. As shown in FIG. 1B, when a high voltage A is inputted, the snapback element 100 is charged until the voltage level of the snapback element 100 reaches a triggering voltage C and then snaps back to a holding voltage D. In a normal high-voltage operation, however, if the snapback element 100 is sometimes triggered, the snapback element 100 is damaged because the holding voltage D is lower than the normal input high voltage. Thus, the manufacturer and the designer have tried very hard to provide an ESD protection device, which has the higher triggering voltage and the higher holding voltage under the operation voltage of the normally high voltage, and has the lower triggering voltage and the lower holding voltage under the ESD event.

FIG. 3 of U.S. Pat. No. 6,965,504 is a circuit diagram showing a conventional ESD protection device. The ESD protection device additionally includes a P-type guard ring and an N-type guard ring respectively disposed outside an adjusting circuit and a snapback element, and a guard ring control circuit is provided to control the P-type guard ring and the N-type guard ring. Thus, the P-type guard ring and the N-type guard ring collects the excess positive and negative charges in the normal operation mode, and the ESD protection device thus has the higher triggering voltage and the higher holding voltage. In the ESD mode, the P-type guard ring and the N-type guard ring do not collect the excess positive and negative charges, so the ESD protection device has the lower triggering voltage and the lower holding voltage.

However, adding the guard ring and the control circuit to the ESD protection circuit may enlarge the area of the circuit in the manufacturing processes and thus increase the cost. Thus, it is an important problem to be solved to provide an ESD protection device capable of having the higher triggering voltage and the higher holding voltage during the normal operation and having the lower triggering voltage and the lower holding voltage during the ESD without greatly enlarging the circuit area.

SUMMARY OF THE INVENTION

The invention is directed to an ESD protection device for a high voltage pad and a method thereof, wherein the ESD protection device has a higher triggering voltage and a higher holding voltage in a normal operation mode, and has a lower triggering voltage and a lower holding voltage in an ESD mode without additionally enlarging the circuit area.

According to a first aspect of the present invention, an ESD protection device for a pad is provided. The ESD protection device includes an adjusting circuit, a snapback element and a control circuit. The adjusting circuit includes a silicon controlled rectifier (SCR) coupled to the pad. The SCR includes a first diode. The snapback element is coupled to an N pole of the first diode when a second diode is not used, and is coupled to an N pole of the second diode when the second diode is used. The control circuit is coupled to the N pole of the first diode. In a normal operation mode, the control circuit provides a first voltage to the N pole of the first diode so that the N pole of the first diode collects charges and the SCR is turned off. In an ESD mode, the control circuit does not provide the first voltage to the N pole of the first diode so that the N pole of the first diode does not collect the charges.

According to a second aspect of the present invention, an ESD protection method for a pad is provided. First, a control circuit controls an adjusting circuit including a silicon controlled rectifier (SCR), which is coupled to the pad and includes a first diode. A snapback element is coupled to an N pole of the first diode when a second diode is not used, and is coupled to an N pole of the second diode when the second diode is used. The control circuit is coupled to the N pole of the first diode. Next, the control circuit provides a first voltage to the N pole of the first diode in a normal operation mode so that the N pole of the first diode collects charges and the SCR is turned off. Then, the control circuit does not provide the first voltage to the N pole of the first diode in an ESD mode so that the first diode does not collect the charges and the SCR is turned on to discharge electrostatic charges on the pad through the SCR.

According to a third aspect of the present invention, an ESD protection structure for a pad is further provided. The ESD protection structure includes a P-substrate, an N-well, a second N-doped region, a third N-doped region and a first gate region. The N-well is disposed in the P-substrate and includes a first P-doped region and a first N-doped region. The first P-doped region is electrically connected to the pad, the first N-doped region is electrically connected to a control circuit, and the first N-doped region and the first P-doped region form a first diode. The second N-doped region is coupled to the first N-doped region. The first gate region, the second N-doped region and the third N-doped region form a snapback element. In a normal operation mode, the control circuit provides a first voltage to the first N-doped region so that the first N-doped region collects charges. In an ESD mode, the control circuit does not provide the first voltage to the first N-doped region so that the first N-doped region does not collect the charges, and electrostatic charges on the pad are discharged through the N-well and the P-substrate.

The invention will become apparent from the following detailed description of the preferred but non-limiting embodiments. The following description is made with reference to the accompanying drawings.

DETAILED DESCRIPTION OF THE INVENTION

Figure 1A:
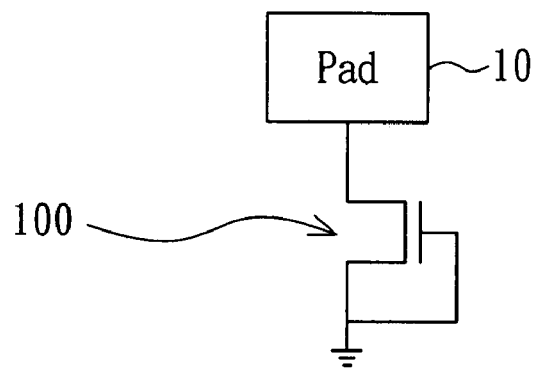
FIG. 1A (Prior Art) is a schematic illustration showing a conventional ESD protection device.
Figure 1B:
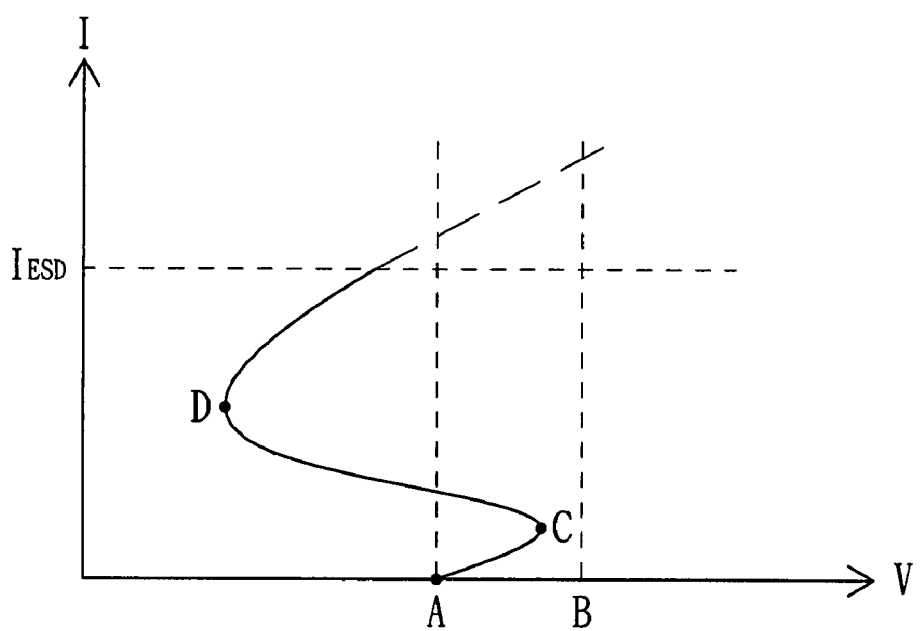
FIG. 1B (Prior Art) shows a current-voltage characteristic curve of a snapback element.
Figure 2A:
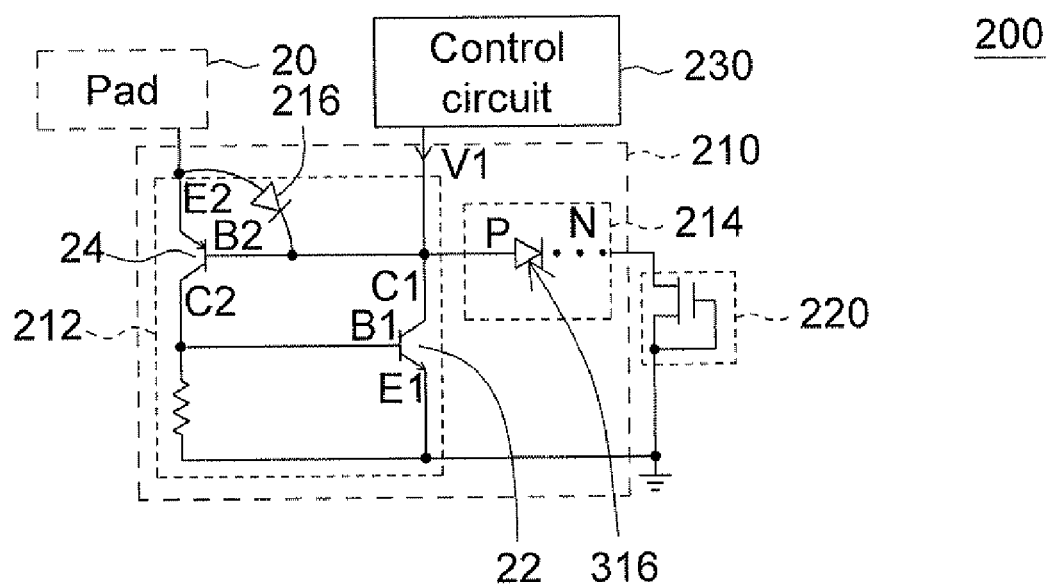
FIG. 2A is a circuit diagram showing an ESD protection device according to a preferred embodiment of the invention.

FIG. 2A is a circuit diagram showing an ESD protection device 200 according to a preferred embodiment of the invention. Referring to FIG. 2A, the ESD protection device 200 includes an adjusting circuit 210, a snapback element 220 and a control circuit 230. The adjusting circuit 210 includes a silicon controlled rectifier (SCR) 212. The SCR 212 is coupled to a pad 20 and includes a first diode 216. The snapback element 220 may be selectively used in conjunction with a diode circuit 214, is coupled to an N pole of the diode circuit 214 (see FIG. 2A) when the diode circuit 214 is used, and is coupled to an N pole (not shown) of the first diode 216 when the diode circuit 214 is not used. The control circuit 230 is coupled to the N pole of the first diode 216. In a normal operation mode, the control circuit 230 provides a first voltage V1 (e.g., a high voltage) to the N pole of the first diode 216 so that the N pole of the first diode 216 collects charges (e.g., electrons with negative charges) and the SCR 212 is turned off. In an ESD mode, the control circuit 230 does not provide the first voltage V1 to the N pole of the first diode 216 so that the N pole of the first diode 216 does not collect the charges and the SCR 212 is turned on to discharge electrostatic charges on the pad 20 through the SCR 212.

More specifically, in the normal operation mode, the first diode 216 receives the first voltage V1 outputted from the control circuit 230 so that the N pole of the first diode 216 collects the charges, and the ESD protection device 200 thus has a higher triggering voltage and a higher holding voltage. In addition, in the ESD mode, the N pole of the first diode 216 does not receive the first voltage V1 outputted from the control circuit 230 in order to disable the first diode 216 from collecting the charges. Thus, the triggering of the snapback element 220 can be speeded up, and the ESD protection device 200 has the lower triggering voltage and the lower holding voltage.

Preferably, the snapback element is an N-type metal oxidation semiconductor (NMOS) transistor, and the SCR 212 further includes an NPN bipolar junction transistor (BJT) 22 and a PNP BJT 24. The NPN BJT 22 has a first collector C1, a first emitter E1 and a first base B1. The PNP BJT 24 has a second collector C2, a second emitter E2 and a second base B2. The P pole of the first diode 216 serves as the second emitter E2, and the N pole of the first diode 216 is electrically connected to the second base B2. When the diode circuit 214 is used, the first collector C1 is coupled to the P pole of the diode circuit 214, as shown in FIG. 2A. When the diode circuit 214 is not used, the first collector C1 is coupled to the snapback element 220 (not shown), the second emitter E2 is coupled to the pad 20, the second base B2 is coupled to the first collector C1, and the second collector C2 is coupled to the first base B1. When the voltage of the electrostatic charges on the pad 20 is higher than the triggering voltage corresponding to the snapback element 220 and the first diode 216 in the ESD mode, the snapback element 220 is triggered, and the NPN BJT 22 and the PNP BJT 24 are turned on so that the electrostatic charges on the pad 20 are discharged through the NPN BJT and the PNP BJT In addition, the adjusting circuit 210 may further include the diode circuit 214 including at least one second diode 316. The snapback element 220 is coupled to the N pole of the first diode 216 through the diode circuit 214. When the adjusting circuit 210 includes the diode circuit 214, the triggering voltage is increased by an amount associated with the number of the second diodes 316 contained in the diode circuit 214. Consequently, when the voltage of the electrostatic charges on the pad 20 is higher than the triggering voltage corresponding to the snapback element 220, the first diode 216 and the diode circuit 214 in the ESD mode, the snapback element 220 is triggered.

Figure 2B:
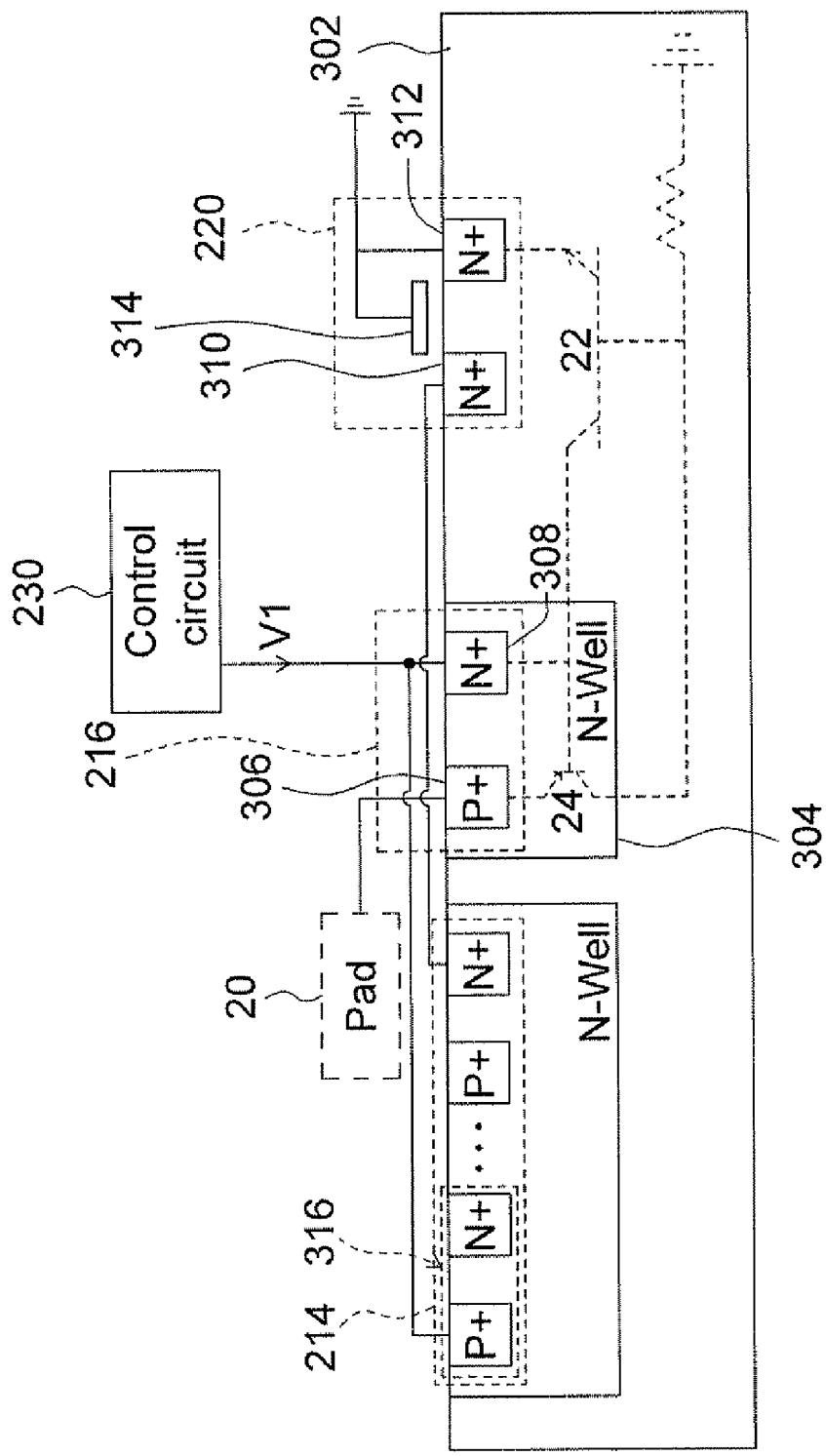
FIG. 2B is a cross-sectional view showing the structure of the ESD protection device according to the preferred embodiment of the invention.

FIG. 2B is a cross-sectional view showing the structure of the ESD protection device according to the preferred embodiment of the invention. Referring to FIG. 2B, the structure of the ESD protection device 200 includes a P-substrate 302 and an N-well 304 disposed in the P-substrate 302. The N-well 304 includes a first P-doped region 306 and a first N-doped region 308. The first P-doped region 306 is electrically connected to the pad 20, the first N-doped region 308 is electrically connected to the control circuit 230, and the first N-doped region 308 and the first P-doped region 306 form the first diode 216. In addition, this structure further includes a second N-doped region 310, a third N-doped region 312 and a first gate region 314. The second N-doped region 310 is coupled to the first N-doped region 308 through the at least one second diode 316. The first gate region 314, the second N-doped region 310 and the third N-doped region 312 form the snapback element 220. In the normal operation mode, the control circuit 230 provides the first voltage V1 to the first N-doped region 308 so that the first N-doped region 308 collects multiple charges. In the ESD mode, the control circuit 230 does not provide the first voltage V1 to the first N-doped region 308 so that the first N-doped region 308 does not collect these charges and the electrostatic charges on the pad 20 are discharged through the N-well 304 and the P-substrate 302.

Furthermore, in the normal operation mode, the electrons in the P-substrate 302 are received by the first N-doped region 308 of the first diode 216 having the first voltage V1, so the P-substrate 302 does not have the electrons necessary for the turning on of the NPN BJT 22 and the PNP BJT 24. So, the NPN BJT 22 and the PNP BJT 24 are difficult to be turned on to make the ESD protection device 200 have the higher triggering voltage and the higher holding voltage. Consequently, when the pad 20 receives the high operation voltage to operate normally, the ESD protection device 200 has the high triggering voltage and the high holding voltage and cannot be easily turned on to prevent the snapback element 220 from being damaged.

When the voltage of the electrostatic charges on the pad 20 is higher than the triggering voltage corresponding to the snapback element 220, the first diode 216 and the diode circuit 214 in the ESD mode, the snapback element 220 is triggered, and the current flows from the pad 20 to the snapback element 220 through the PNP BJT 24, the first diode 216 and the diode circuit 214. At this time, the current flowing through the base of the PNP BJT 24 triggers the NPN BJT 22 so that the NPN BJT 22 is turned on and the current flows therethrough. After the NPN BJT 22 is turned on, the current flowing through the PNP BJT 24 is increased. The positive feedback effect of the current between the NPN BJT 22 and the PNP BJT 24 turns on the SCR 212 to rapidly discharge the electrostatic charges on the pad 20 through the P-substrate 302 and thus to achieve the object of the ESD protection. Consequently, when the electrostatic charges are generated on the pad 20, the ESD protection device 200 has the low triggering voltage and the low holding voltage so that the transistors are rapidly turned on to discharge the electrostatic charges and thus to achieve the better ESD protection effect.

The number of diodes in the diode circuit 214 influences the triggering voltage and the holding voltage of the ESD protection device 200, and the following relationship is established:

$$Vtc \approx Vtn + n \times Vd; \text{ and}$$

$$Vhc \approx Vhn + n \times Vd.$$

wherein Vtc is the triggering voltage of the ESD protection device 200, Vtn is the triggering voltage of the snapback element 220, (n−1) is the number of the second diode(s) in the diode circuit 214, the number of the first diode plus the number of the second diode(s) in the diode circuit 214 is equal to n, Vd is the turned-on voltage drop across one turned-on diode, Vhc is the holding voltage of the ESD protection device 200, and Vhn is the holding voltage of the snapback element 220. According to the above-mentioned equations, as the number (n−1) of the diodes in the diode circuit 214 gets greater, the triggering voltage Vtc and the holding voltage Vhc of the ESD protection device 200 get higher or otherwise get lower. The snapback element 220 receives the input voltage, which is dropped by the diode circuit 214, and the dropped input voltage charges the snapback element 220. When the snapback element 220 is charged to the triggering voltage Vtn, the triggering voltage Vtn is rapidly snapped back to the holding voltage Vhn.

Several examples of implementing the ESD protection device 200 will be described for the purpose of clearness.

FIRST EXAMPLE

Figure 3:
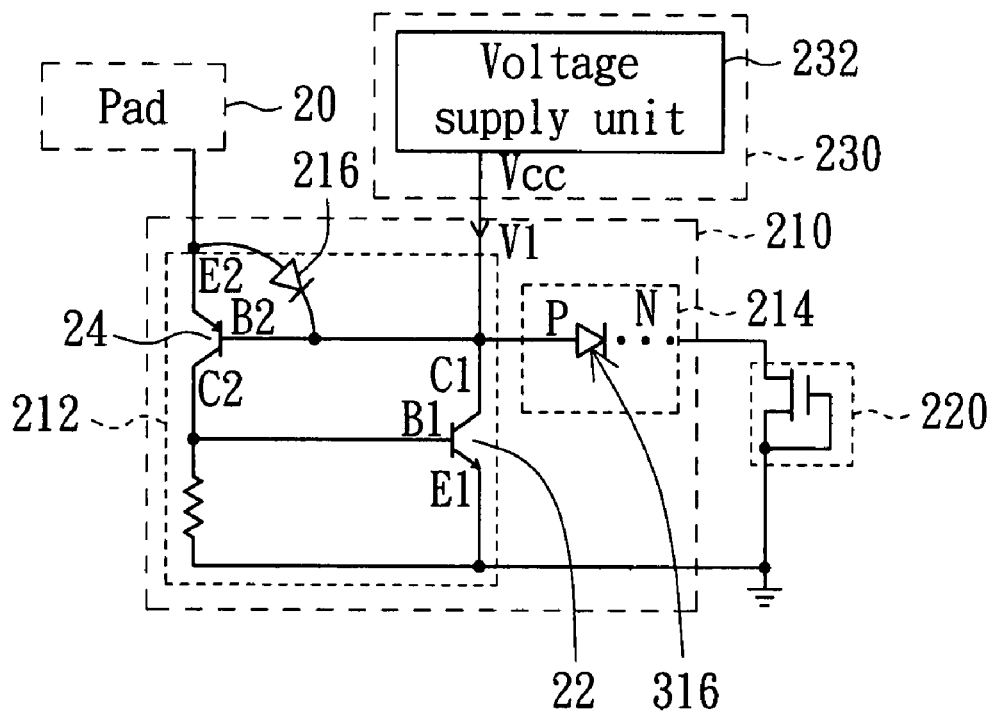
FIG. 3 is a circuit diagram showing a first example of the ESD protection device of FIG. 2A.

FIG. 3 is a circuit diagram showing a first example of the ESD protection device of FIG. 2A. Referring to FIG. 3, the control circuit 230 includes a voltage supply unit 232 for supplying the first voltage V1 (e.g., the high voltage Vcc) to the adjusting circuit 210. In the normal operation mode, the voltage supply unit 232 provides the first voltage V1; and in the ESD mode, the voltage supply unit 232 does not provide any voltage.

SECOND EXAMPLE

Figure 4A:
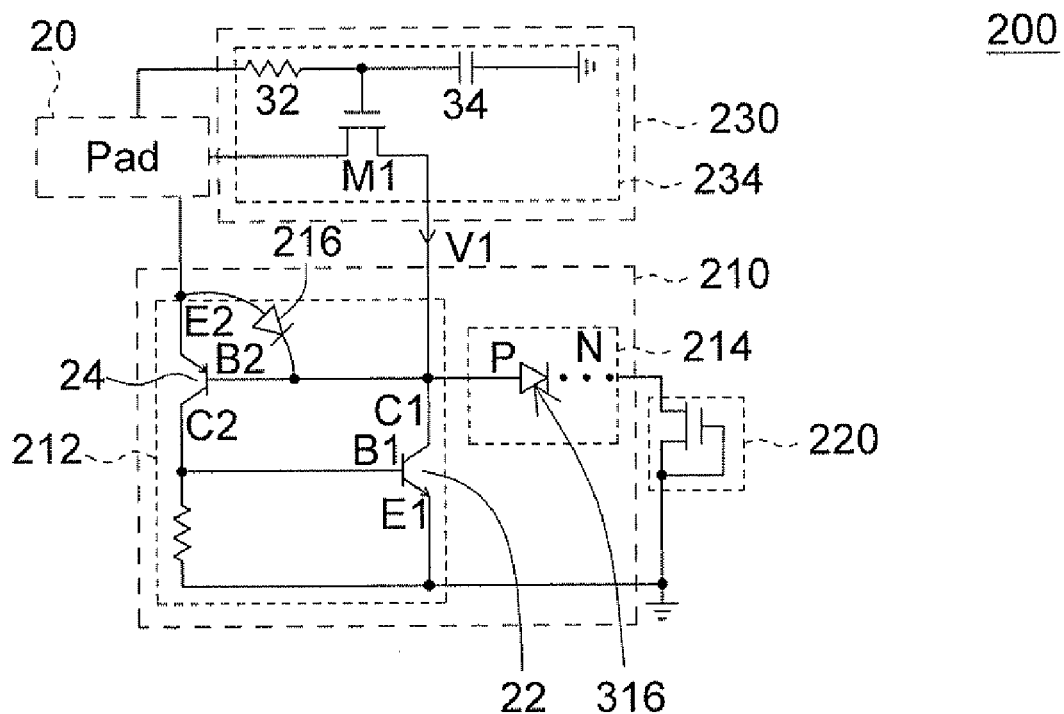
FIG. 4A is a circuit diagram showing a second example of the ESD protection device of FIG. 2A.
Figure 4B:
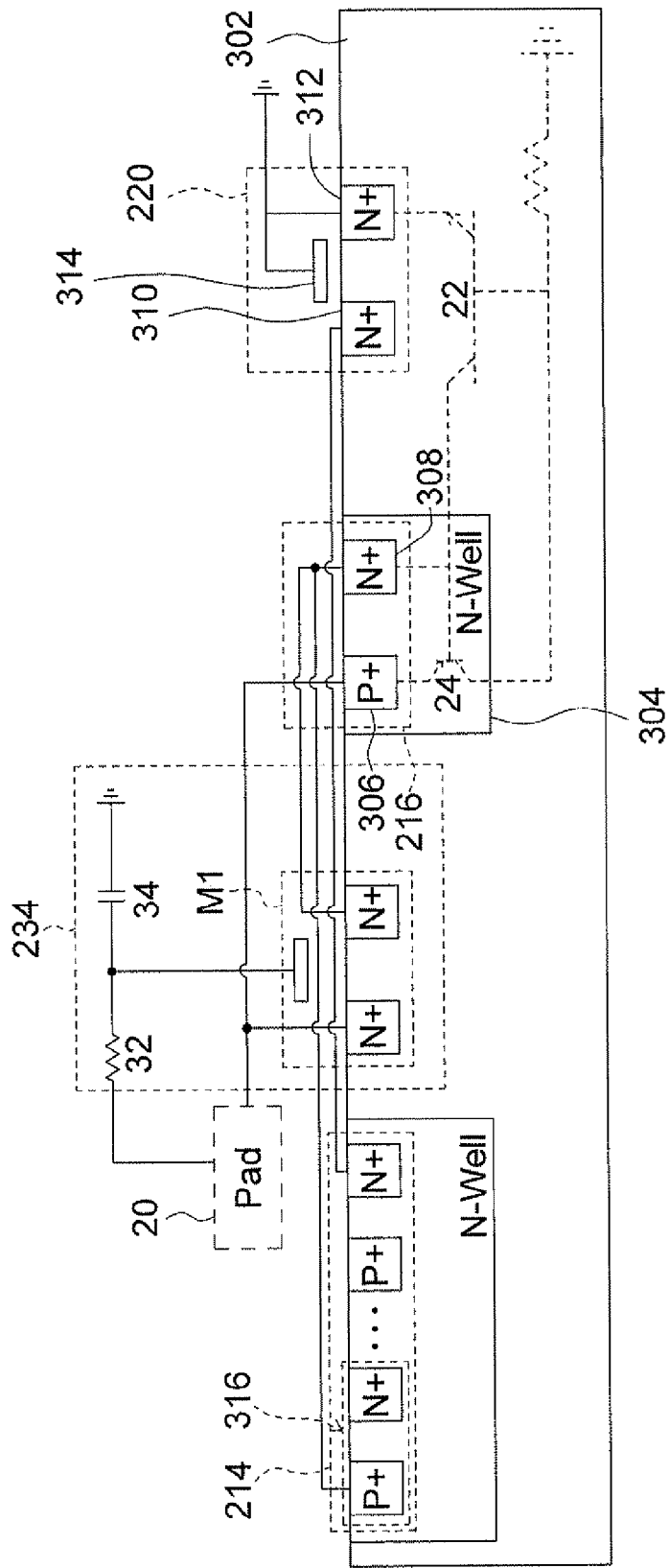
FIG. 4B is a cross-sectional view showing the structure of the ESD protection device of FIG. 4A.

FIG. 4A is a circuit diagram showing a second example of the ESD protection device of FIG. 2A. FIG. 4B is a cross-sectional view showing the structure of the ESD protection device of FIG. 4A. Referring to FIGS. 4A and 4B, the control circuit 230 of the ESD protection device 200 includes a switch circuit 234 coupled to and between the N pole and the pad 20 of the first diode 216. In the normal operation mode, the switch circuit 234 is in the turn-on state; and in the ESD mode, the switch circuit 234 is in the turn-off state. The switch circuit 234 includes an NMOS transistor M1, a resistor 32 and a capacitor 34. The resistor 32 has one end electrically connected to one end of the capacitor 34, and the other end coupled to the pad 20. The other end of the capacitor 34 is coupled to the ground voltage. The NMOS transistor M1 has a gate coupled to a node between the capacitor 34 and the resistor 32, a drain coupled to the pad 20, and a source coupled to the N pole of the first diode 216. In the normal operation mode, the voltage on the pad 20 charges the capacitor 34 to turn on the NMOS transistor M1 so that the voltage on the pad 20 serves as the first voltage V1 to be provided to the N pole of the first diode 216. In the ESD mode, the crossover voltage of the capacitor 34 is almost equal to zero to turn off the NMOS transistor M1 so that the control circuit 230 does not provide the first voltage V1 to the N pole of the first diode 216. The high voltage of the electrostatic charges instantaneously generated on the pad 20 is late for the charging of the capacitor 34 so that the NMOS transistor M1 is still kept off and the high-voltage electrostatic charges are discharged through the SCR 212.

THIRD EXAMPLE

Figure 5A:
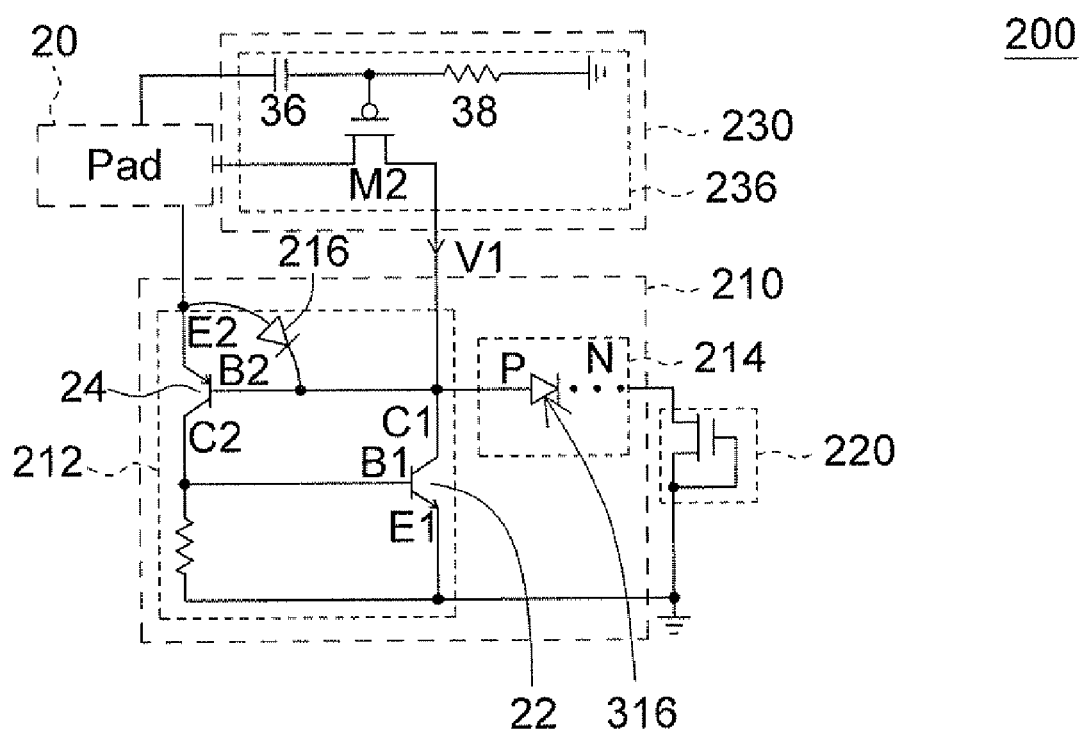
FIG. 5A is a circuit diagram showing a third example of the ESD protection device of FIG. 2A.
Figure 5B:
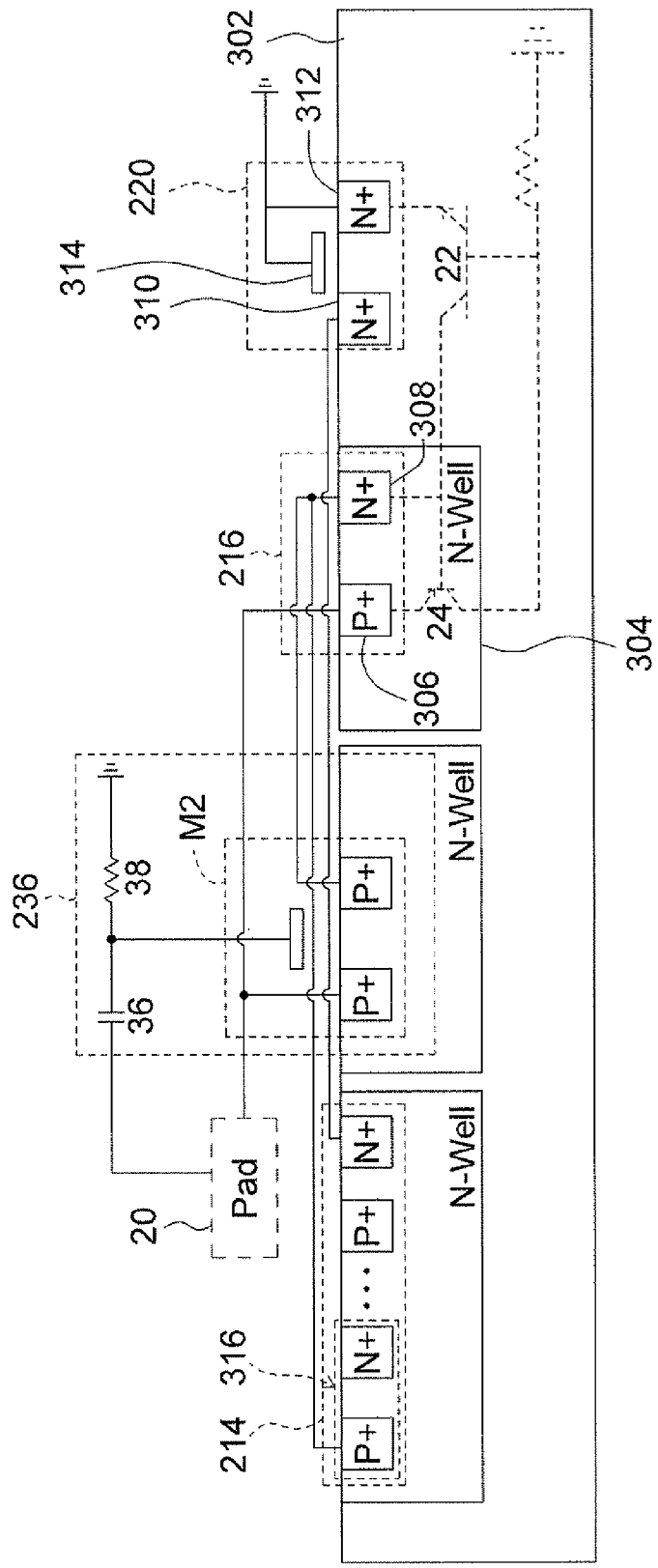
FIG. 5B is a cross-sectional view showing the structure of the ESD protection device of FIG. 5A.

FIG. 5A is a circuit diagram showing a third example of the ESD protection device of FIG. 2A. FIG. 5B is a cross-sectional view showing the structure of the ESD protection device of FIG. 5A. Referring to FIGS. 5A and 5B, a switch circuit 236 includes a PMOS transistor M2, a capacitor 36 and a resistor 38. The resistor 38 has one end electrically connected to one end of the capacitor 36, and the other end coupled to the ground voltage. The other end of the capacitor 36 is coupled to the pad 20. The PMOS transistor M2 has a gate coupled to a node between the capacitor 36 and the resistor 38, a drain coupled to the N pole of the first diode 216, and a source coupled to the pad 20. In the normal operation mode, the voltage on the pad 20 charges the capacitor 36 so that the voltage of the gate of the PMOS transistor M2 is the low voltage and the PMOS transistor M2 is turned on, and the voltage on the pad 20 serves as the first voltage V1 to be supplied to the N pole of the first diode 216. In the ESD mode, when the pad 20 suddenly has the electrostatic charges generated to form the high voltage, the high voltage is couple to the other end of the capacitor 36 so that the voltage of the gate of the PMOS transistor M2 is increased and the PMOS transistor M2 is turned off, and the control circuit 230 does not provide the first voltage V1 to the N pole of the first diode 216. At this time, the high-voltage electrostatic charges are discharged through the SCR 212.

FOURTH EXAMPLE

Figure 6A:
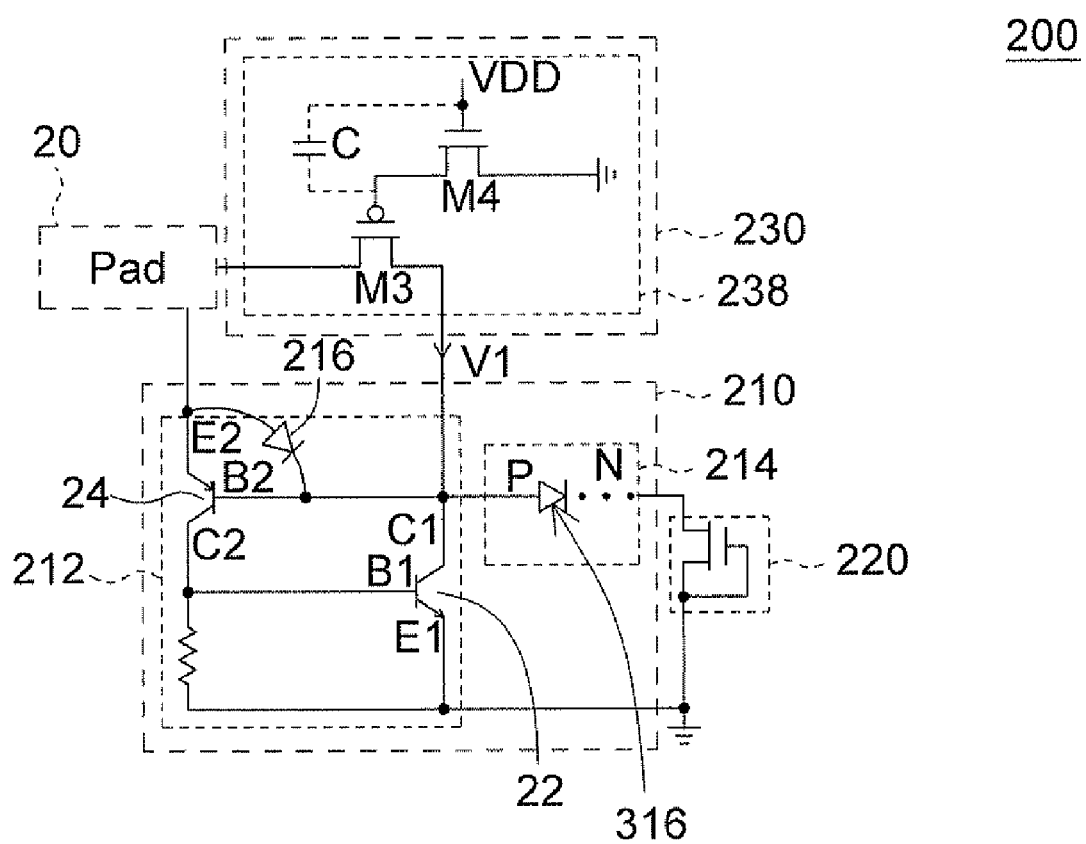
FIG. 6A is a circuit diagram showing a fourth example of the ESD protection device of FIG. 2A.
Figure 6B:
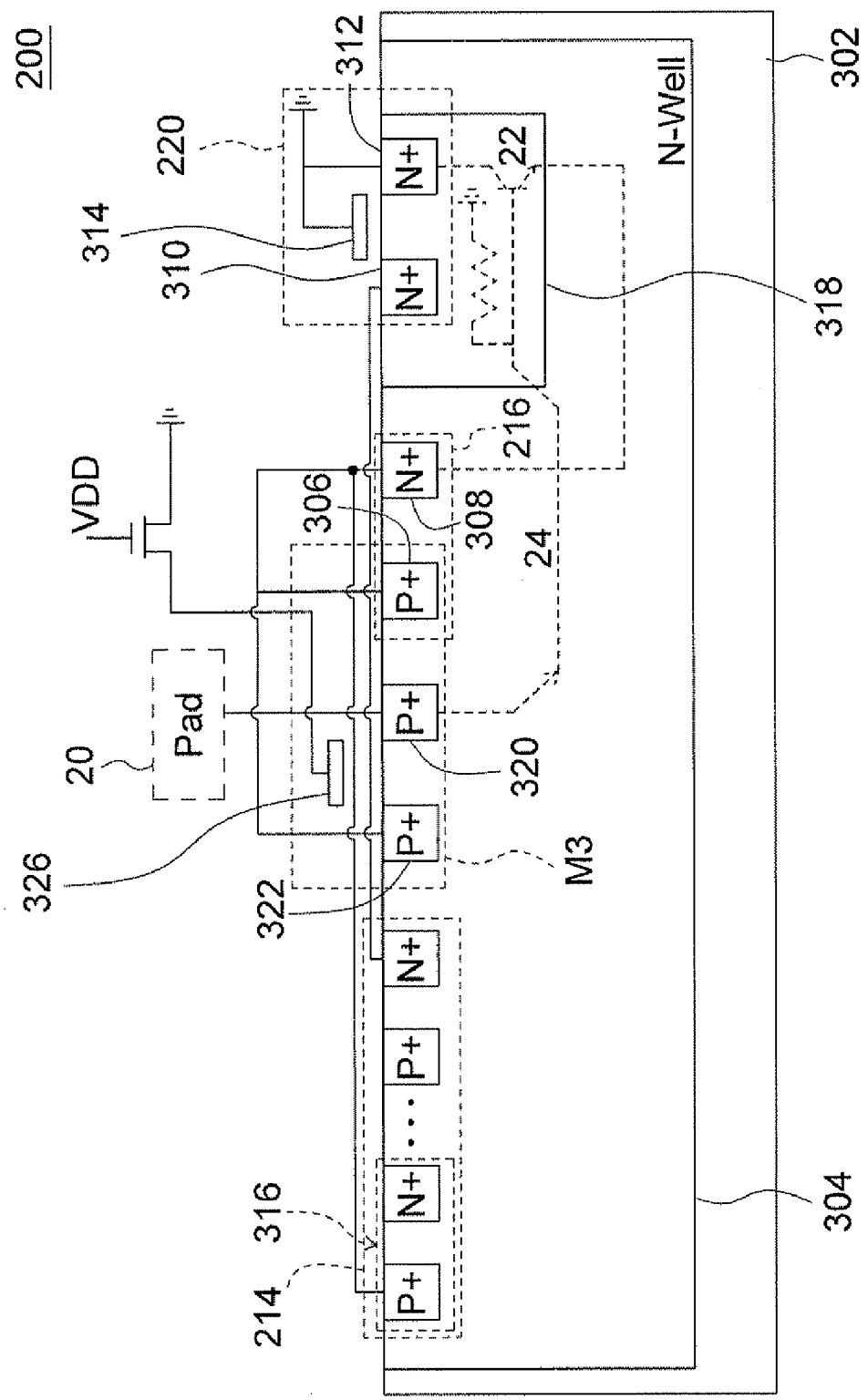
FIG. 6B is a cross-sectional view showing the structure of the ESD protection device of FIG. 6A.

FIG. 6A is a circuit diagram showing a fourth example of the ESD protection device of FIG. 2A. FIG. 6B is a cross-sectional view showing the structure of the ESD protection device of FIG. 6A. Referring to FIGS. 6A and 6B, the control circuit 230 includes a switch circuit 238, which includes a PMOS transistor M3 and an NMOS transistor M4. The NMOS transistor M4 has a first gate, a first drain and a first source, and the PMOS transistor M3 has a second gate, a second drain and a second source. The first gate is coupled to a voltage source Vcc, the first source is coupled to the ground voltage, and the first drain is coupled to the second gate. The second source is coupled to the N pole of the first diode 216, and the second drain is coupled to the pad 20.

As shown in FIG. 6B, what is different from FIG. 4B is that the structure of the ESD protection device 200 further includes a P-well 318 substantially disposed in the N-well 304. The second N-doped region 310 and the third N-doped region 312 are formed in the P-well 318. The N-well 304 further includes a second P-doped region 320, a third P-doped region 322, a second gate region 324 and a third gate region 326. The second gate region 324 is located between the first P-doped region 306 and the second P-doped region 320, and the third gate region 326 is located between the second P-doped region 320 and the third P-doped region 322. The second P-doped region 320, the first P-doped region 306 and the second gate region 324 form a PMOS transistor, and the second P-doped region 320, the third P-doped region 322 and the third gate region 326 form another PMOS transistor. The two PMOS transistors are connected in parallel to obtain the PMOS transistor M3 of FIG. 6A. This PMOS transistor M3 is the soft-pulled PMOS transistor. A portion of the structure of the PMOS transistor M3 may be shared with the first diode 216 so that the area can be saved.

In this example, the operation method of the switch circuit 238 may approach the switch circuit 236 of FIG. 5A according to the parasitic capacitor C between the source and the gate of the PMOS transistor M3 and the equivalent resistor obtained when the NMOS transistor M4 is turned on. In the normal operation mode, the NMOS transistor M4 is turned on so that the PMOS transistor M3 is also turned on. In the ESD mode, the PMOS transistor M3 is turned off. Other operation methods of the circuit are similar to those of the ESD protection device of FIG. 5A, so detailed descriptions thereof will be omitted.

In the ESD protection device according to the embodiment of the invention, the N pole of the first diode collects the charges in the normal operation mode so that the SCR cannot be easily turned on, and the N pole of the first diode does not collect the charges in the ESD mode so that the SCR can be quickly turned on. The ESD protection device according to this embodiment of the invention utilizes the N pole of the first diode to collect the excess charges to obtain the ideal triggering voltage and the ideal holding voltage and thus to achieve the object of the good ESD protection. In addition, the ESD protection device does not have the conventional guard ring, so the area of the integrated circuit can be effectively reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrostatic discharge (ESD) protection device, comprising:
   an adjusting circuit, which comprises:
   a silicon controlled rectifier (SCR) comprising a first diode, wherein the first diode comprises a P region coupled to a pad and an N region;
   a snapback element coupled to the N region of the first diode, wherein the snapback element is coupled to the pad through the first diode;
   a diode circuit, coupled between the first diode and the snapback element; and
   a control circuit, which is coupled to the N region of the first diode, provides a first voltage to the N region of the first diode in a normal operation mode so that the SCR is turned off, and does not provide the first voltage to the N region of the first diode in an ESD mode so that a current flows from the pad to the snapback element through the first diode and the diode circuit to trigger the snapback element, and the SCR is turned on to discharge electrostatic charges on the pad through the SCR.

2. The device according to claim 1, wherein, the snapback element is an N-type metal oxidation semiconductor (NMOS) transistor, the SCR further comprises an NPN bipolar junction transistor (BJT) and a PNP BJT, the NPN BJT has a first collector, a first emitter and a first base, the PNP BJT has a second collector, a second emitter and a second base, the first diode has the P region serving as the second emitter and the N region electrically connected to the second base, the first collector is coupled to the snapback element, the second emitter is coupled to the pad, the second base is coupled to the first collector, the second collector is coupled to the first base, and when a voltage of the electrostatic charges on the pad is higher than a triggering voltage corresponding to the first diode, the diode circuit and the snapback element in the ESD mode, the snapback element is triggered and the NPN BJT and the PNP BJT are turned on so that the electrostatic charges on the pad are discharged through the NPN BJT and the PNP BJT.

3. The device according to claim 1, wherein the control circuit comprises a voltage supply unit for supplying the first voltage.

4. The device according to claim 1, wherein the control circuit comprises a switch circuit coupled to and between the N region of the first diode and the pad, the switch circuit is in a turn-on state in the normal operation mode and the switch circuit is in a turn-off state in the ESD mode.

5. The device according to claim 4, wherein the switch circuit includes a resistor, a capacitor and an N-type metal oxidation semiconductor (NMOS) transistor, the resistor has one end electrically connected to one end of the capacitor and the other end coupled to the pad, the other end of the capacitor is coupled to a ground voltage, and the NMOS transistor has a gate coupled to a node between the capacitor and the resistor, a first source/drain coupled to the pad, and a second source/drain coupled to the N region of the first diode.

6. The device according to claim 4, wherein the switch circuit comprises a capacitor, a resistor and a P-type metal oxidation semiconductor (PMOS) transistor, the resistor has one end electrically connected to one end of the capacitor and the other end coupled to a ground voltage, the other end of the capacitor is coupled to the pad, and the PMOS transistor has a gate coupled to a node between the capacitor and the resistor, a first source/drain coupled to the N region of the first diode and a second source/drain coupled to the pad.

7. The device according to claim 4, wherein the switch circuit comprises an NMOS transistor having a first gate, a first source/drain and a second source/drain, and a P-type metal oxidation semiconductor (PMOS) transistor having a second gate, a third source/drain and a fourth source/drain, the first gate is coupled to a voltage supply unit, the second source/drain is coupled to a ground voltage, the first source/drain is coupled to the second gate, the fourth source/drain is coupled to the N region of the first diode, and the third source/drain is coupled to the pad.

8. The device according to claim 1, wherein the diode circuit comprises at least one second diode, and the snapback element is coupled to the N region of the first diode through the diode circuit.

9. The device according to claim 8, wherein the number of the at least one second diode determines a triggering voltage and a holding voltage of the ESD protection device.

10. The device according to claim 9, wherein the triggering voltage of the ESD protection device is equal to a triggering voltage of the snapback element plus a product, which is obtained by multiplying a sum of the numbers of the first diode and the second diodes by a turned-on voltage drop.

11. The device according to claim 9, wherein the holding voltage of the ESD protection device is equal to a holding voltage of the snapback element plus a product, which is obtained by multiplying a sum of the numbers the first diode and the second diodes by a turned-on voltage drop.

12. An electrostatic discharge (ESD) protection method, comprising:
utilizing a control circuit to control an adjusting circuit comprising a silicon controlled rectifier (SCR), which is coupled to a pad and comprises a first diode, wherein the first diode comprises a P region coupled to the pad and an N region, a snapback element is coupled to the N region of the first diode through a diode circuit and coupled to the pad through the first diode and the diode circuit, and the control circuit is coupled to the N terminal of the first diode;
enabling the control circuit to provide a first voltage to the N region of the first diode in a normal operation mode so that the SCR is turned off; and
disabling the control circuit from providing the first voltage to the N region of the first diode in an ESD mode so that a current flows from the pad to the snapback element through the first diode and the diode circuit to trigger the snapback element, and the SCR is turned on to discharge electrostatic charges on the pad through the SCR.

13. The method according to claim 12, wherein the SCR further comprises a PNP bipolar junction transistor (BJT) having a second collector, a second emitter and a second base, and an NPN BJT having a first collector, a first emitter and a first base, the first diode has the P region serving as the second emitter and the N region electrically connected to the second base, the first collector is coupled to the snapback element, the second emitter is coupled to the pad, the second base is coupled to the first collector, the second collector is coupled to the first base, and when a voltage of the electrostatic charges on the pad is greater than a triggering voltage corresponding to the snapback element, the diode circuit and the first diode in the ESD mode, the snapback element is triggered and the NPN BJT and the PNP BJT are turned on so that the electrostatic charges on the pad are discharged through the NPN BJT and the PNP BJT.

14. The method according to claim 12, wherein the control circuit comprises a switch circuit coupled to and between the N region of the first diode and the pad, the switch circuit is in a turn-on state in the normal operation mode, and the switch circuit is in a turn-off state in the ESD mode.

15. The method according to claim 14, wherein the switch circuit comprises a resistor, a capacitor and an NMOS transistor, the resistor has one end electrically connected to one end of the capacitor, and the other end coupled to the pad, the other end of the capacitor is coupled to a ground voltage, and the NMOS transistor has a gate coupled to a node between the capacitor and the resistor, a first source/drain coupled to the pad, and a second source/drain coupled to the N region of the first diode.

16. The method according to claim 14, wherein the control circuit comprises a capacitor, a resistor and a PMOS transistor, the resistor has one end coupled to the capacitor and the other end coupled to a ground voltage, the other end of the capacitor is coupled to the pad, and the PMOS transistor has a gate coupled to a node between the capacitor and the resistor, a first source/drain coupled to the N region of the first diode, and a second source/drain coupled to the pad.

17. The method according to claim 14, wherein the control circuit comprises a PMOS transistor having a second gate, a third source/drain and a fourth source/drain, and an NMOS transistor having a first gate, a first source/drain and a second source/drain, the first gate is coupled to a voltage supply unit, the second source/drain is coupled to a ground voltage, the first source/drain is coupled to the second gate, the fourth source/drain is coupled to the N region of the first diode, and the third source/drain is coupled to the pad.

18. The method according to claim 12, wherein the diode circuit comprises at least one second diode, and the snapback element is coupled to the N region of the first diode through the diode circuit.

19. The method according to claim 18, wherein the number of the at least one second diode determines a triggering voltage and a holding voltage of the ESD protection device.

20. The method according to claim 19, wherein the triggering voltage of the ESD protection device is equal to a triggering voltage of the snapback element plus a product, which is obtained by multiplying a sum of the numbers of the first diode and the second diodes by a turned-on voltage drop.

21. The method according to claim 19, wherein the holding voltage of the ESD protection device is equal to a holding voltage of the snapback element plus a product, which is obtained by multiplying a sum of the numbers the first diode and the second diodes by a turned-on voltage drop.

22. An electrostatic discharge (ESD) protection structure, comprising:
a P-substrate;
an N-well disposed in the P-substrate, the N-well comprising:
a first P-doped region electrically connected to a pad; and
a first N-doped region electrically connected to a control circuit, wherein the first N-doped region and the first P-doped region form a first diode;
a second N-doped region directly coupled to the first N-doped region, wherein the second N-doped region is coupled to the pad through the first diode;
a third N-doped region; and
a first gate region, wherein the first gate region, the second N-doped region and the third N-doped region form a snapback element,
wherein the control circuit provides a first voltage to the first N-doped region in a normal operation mode so that the first N-doped region collects a plurality of charges, the control circuit does not provide the first voltage to the first N-doped region in an ESD mode so that the first N-doped region does not collect the charges, and electrostatic charges on the pad are discharged through the N-well and the P-substrate.

23. The structure according to claim 22, wherein a parasitic PNP bipolar junction transistor (BJT) is formed between the N-well, the P-substrate and the first P-doped region, a parasitic NPN BJT is formed between the P-substrate, the third N-doped region and the first N-doped region, and when a voltage of the electrostatic charges on the pad is higher than a triggering voltage corresponding to the snapback element and the first diode in the ESD mode, the snapback element is triggered, and the parasitic NPN BJT and the parasitic PNP BJT are turned on so that the electrostatic charges on the pad are discharged through the parasitic NPN BJT and the parasitic PNP BJT.

24. The structure according to claim 22, further comprising a P-well substantially disposed in the N-well, wherein the second N-doped region and the third N-doped region are formed in the P-well, the N-well further comprises a second P-doped region and a second gate region, which is located between the first P-doped region and the second P-doped region, the second P-doped region, the first P-doped region and the second gate region form a PMOS transistor, the control circuit comprises the PMOS transistor, an NMOS transistor and a voltage supply unit, the NMOS transistor has a third gate coupled to the voltage supply unit, a first source/drain coupled to a second gate, and a second source/drain coupled to a ground voltage, the second P-doped region is coupled to the pad, and the first P-doped region is coupled to the first N-doped region.

\* \* \* \* \*